US006806780B2

(12) United States Patent
Fontaine et al.

(10) Patent No.: US 6,806,780 B2
(45) Date of Patent: Oct. 19, 2004

(54) EFFICIENT MODULATION COMPENSATION OF SIGMA DELTA FRACTIONAL PHASE LOCKED LOOP

(75) Inventors: Paul H. Fontaine, Richardson, TX (US); Abdellatif Bellaouar, Dallas, TX (US); Bertan Bakkaloglu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 71 days.

(21) Appl. No.: 10/387,850

(22) Filed: Mar. 13, 2003

(65) Prior Publication Data

US 2004/0178859 A1 Sep. 16, 2004

(51) Int. Cl.⁷ .................................................. H03L 7/00
(52) U.S. Cl. ...................................... 331/17; 375/297
(58) Field of Search .......................... 331/17; 375/297, 375/296, 305, 336; 332/100, 101

(56) References Cited

U.S. PATENT DOCUMENTS

| | | | |
|---|---|---|---|
| 5,038,120 A | 8/1991 | Wheatley et al. | 332/128 |
| 6,008,703 A | 12/1999 | Perrott et al. | 332/100 |
| 6,141,390 A * | 10/2000 | Cova | 375/297 |
| 6,229,400 B1 | 5/2001 | McCollough et al. | 331/17 |
| 2003/0054788 A1 * | 3/2003 | Sugar et al. | 455/323 |
| 2003/0206056 A1 * | 11/2003 | Hietala | 330/100 |
| 2003/0215025 A1 * | 11/2003 | Hietala | 375/297 |
| 2003/0215026 A1 * | 11/2003 | Hietala | 375/297 |
| 2003/0231068 A1 * | 12/2003 | Humphreys | 331/17 |

OTHER PUBLICATIONS

Daniel R. McMahill and Charles G. Sodini, A 2. 5–Mb / s GFSK 5. 0 –Mb / s 4 –FSK Automically Calibrated —Frequency Synthesizer IEEE Journal of Solid State Circuits, vol. 37, No. 1, pp. 18–26, Jan. 2002.

* cited by examiner

Primary Examiner—Robert Pascal
Assistant Examiner—Joseph Chang
(74) Attorney, Agent, or Firm—Ronald O. Neerings; Wade James Brady, III; Frederick J. Telecky, Jr.

(57) ABSTRACT

A technique is provided for achieving efficient modulation compensation of a ΣΔ fractional PLL. The parameters of the PLL TF are the gain, $K_{pll}$, of the PLL and the time constants associated with the loop filter. A careful design of the PLL allows setting the poles and zeros of the PLL TF to fixed values, independent of process and temperature. The unknown parameters of the system are then reduced to one: the PLL gain, K which is the product of the Voltage Controlled Oscillator (VCO), Phase Detector (PD) and divider gains. One unknown variable can be then determined via a single equation, that can be derived at a single frequency. The measurement of a low frequency modulated single tone, for example, is sufficient to characterize the entire PLL TF.

12 Claims, 7 Drawing Sheets

$+\dfrac{K_{nom}}{K}\cdot$

EFFICIENT MODULATION COMPENSATION OF SIGMA DELTA FRACTIONAL PHASE LOCKED LOOP

BACKGROUND OF THE INVENTION

1. Field of the Invention

This invention relates generally to phase locked loops, and more particularly to a system and method of efficient modulation compensation of a ΣΔ fractional phase locked loop.

2. Description of the Prior Art

A ΣΔ fractional phase locked loop (PLL) has to filter its associated quantization noise. This filtering creates a limited system bandwidth that undesirably filters the modulated data, degrading the Bit Error Rate (BER). A predistortion filter is generally employed to compensate for the limited system bandwidth and to provide a global flat transfer function (TF). Because integrated circuit (IC) process variations as well as other parameters (e.g. supply, temperature, transmit target frequency and the like) modify the PLL TF, the TF needs to be measured prior to any transmission in order to compute the requisite predistortion filter.

The TFs associated with known PLLs have many variable parameters. Further, the perturbation that is sent to estimate the associated TF must cover all frequency ranges of interest, and is usually a pulse (time Dirac=uniform power spectrum density). This technique has numerous shortcomings related to time and computation limiting constraints. Some of these shortcomings include 1) the impulse phase response of the PLL can be long; 2) the impulse phase response is not synchronous with the reference clock; 3) the impulse phase response is difficult to measure with on-chip circuitry; and 4) the Inverse Laplace Transform (ILT) of the response has a heavy computational burden, often requiring DSP interruptions.

In view of the foregoing, it is highly desirable and advantageous to have a fast, simple, accurate, on-chip tuning scheme to achieve modulation compensation of a ΣΔ fractional PLL that eliminates the foregoing shortcomings associated with known PLLs.

SUMMARY OF THE INVENTION

The present invention is directed to a technique for achieving efficient modulation compensation of a ΣΔ fractional PLL. The parameters of the PLL TF are the gain, $K_{pll}$, of the PLL and the time constants associated with the loop filter. A careful design of the PLL allows setting the poles and zeros of the PLL TF to fixed values, independent of process and temperature. The unknown parameters of the system are then reduced to one: the PLL gain, K which is the product of the Voltage Controlled Oscillator (VCO), Phase Detector (PD) and divider gains. One unknown variable can be then determined via a single equation that can be derived at a single frequency. The measurement of a low frequency modulated single tone, for example, is sufficient to characterize the entire PLL TF. This technique is advantageous over the prior art since it 1) provides a very short perturbation response from the system to measure its associated TF, reducing the lock time of the transmit PLL;, which is a critical parameter according to any wireless standard; and 2) enables a simple on-chip measurement of the perturbation response, as well as a straightforward design of the compensation filter.

The foregoing technique therefore provides a fast, simple, accurate, on-chip tuning scheme for modulation compensation of a ΣΔ fractional PLL in which 1) the required response time is the tone period (in fact half the period); 2) the tone period can be coherent with a reference clock (synchronous); 3) the impulse phase response is easier to measure at one low frequency; and 4) no computationally intense ILT must be computed.

According to one embodiment, a method for characterizing a phase locked loop (PLL) transfer function comprises the steps of specifying a PLL having a transfer function defined in terms of a PLL gain and a plurality of time constants associated with the loop filter, setting the PLL transfer function poles and zeros to fixed values, independent of process and temperature variations such that unknown PLL parameters are reduced to solely the PLL gain; measuring a low frequency modulated single frequency modulated tone signal via the PLL, and generating a perturbation response thereto; estimating an attenuation factor based on the perturbation response; and characterizing the PLL transfer function associated with the attenuation factor, wherein the attenuation factor determines the PLL gain.

According to another embodiment, a method for characterizing a phase locked loop (PLL) transfer function that is dependent solely on the PLL gain K, comprises the steps of measuring a low frequency modulated single frequency modulated tone signal via the PLL, and generating a perturbation response thereto; estimating an attenuation factor based on the perturbation response; and characterizing the PLL transfer function associated with the attenuation factor, wherein the attenuation factor determines the PLL gain K.

According to yet another embodiment of the present invention, a phase locked loop (PLL) predistortion filter comprises an uncompensated filter; and a weighted predistortion filter, wherein the PLL predistortion filter comprises the sum of the uncompensated filter and the weighted predistortion filter, and further wherein the predistortion filter has only fixed coefficients that do not require computation in association with a tuning block.

According to still another embodiment of the present invention, a predistortion filter comprising an uncompensated PLL filter summed with a weighted predistortion filter, wherein the predistortion filter comprises fixed coefficients that are substantially independent of process, voltage and temperature variations, and further comprises no more than one variable element.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

The PLL bandwidth associated with a fractional-N single-channel modulation synthesizer is constrained to a relatively low value due to high-frequency quantization phase noise filtering considerations. On the other hand, the system needs to pass the modulated information signal which has its own bandwidth. Regarding Global System for Mobile Communications (GSM) applications, due to quantization noise limitation, PLL bandwidth is typically about 100 kHz, which is close to the Gaussian filtered minimum shift keying (GMSK) modulated data bandwidth. The system block diagram 10 shown in FIG. 1 represents the modulation filter (GMSK) 12, the band limited system (LPF) 14, and a specified measurement for this standard (the RMS phase error) 18.

Figure 1:
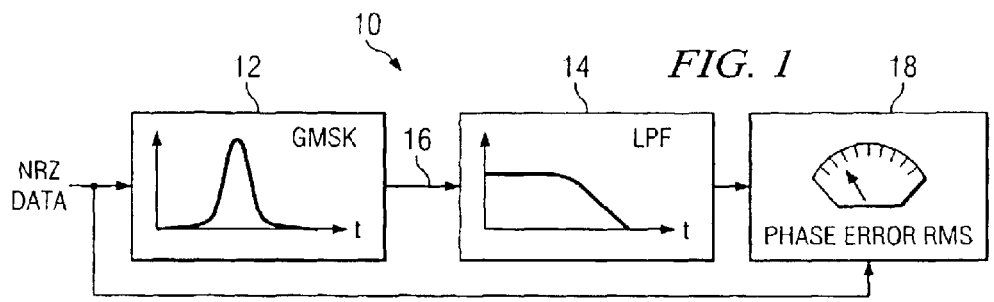
FIG. 1 is a simplified block diagram illustrating a specified measurement of the standard RMS phase error associated with a modulation filter (GMSK) and a band limited system (LFP)
Figure 2:
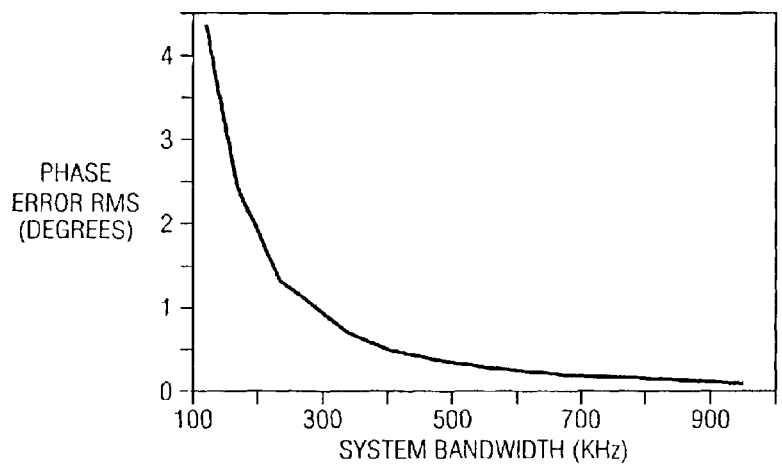
FIG. 2 is a plot illustrating phase error RMS versus system bandwidth for the system depicted in FIG. 1.

FIG. 2 is a plot illustrating phase error RMS versus system 14 bandwidth for the system 10 depicted in FIG. 1. The limited bandwidth of the system (LPF) 14 can be seen to degrade the RMS phase error of the high frequency (HF) modulated signal at the transmitter output 16 shown in FIG. 1.

Figure 3:
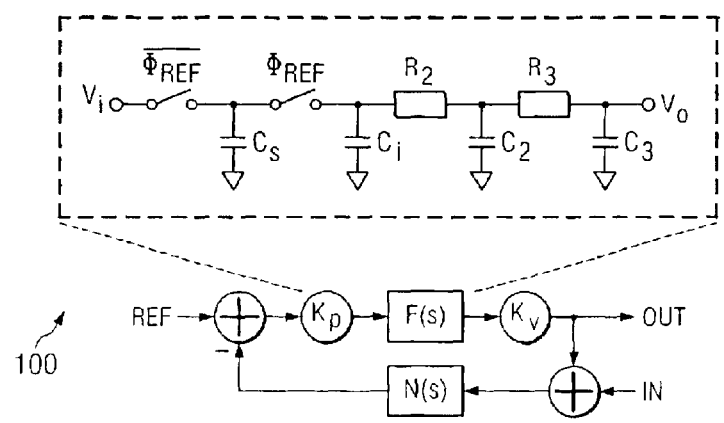
FIG. 3 is a block diagram illustrating a PLL according to one embodiment of the present invention.

The PLL is most preferably a type-I, due to the simplicity of its transfer function given by equation (1) below, for a 3-pole loop filter, such as the 3-pole loop filter 100 shown in FIG. 3. A type-II PLL introduces an extra pole at DC, and a zero for stability purposes, the extra pole introducing more variability in the transfer function.

$$T(s) = \frac{1}{1 + \frac{s}{K} \cdot (1 + as + bs^2 + cs^3)}, \qquad (1)$$

where K, a, b and c are respectively the PLL gain and the time constants associated with each of the poles of the loop filter. These parameters most preferably are sized for stability, lock time and phase noise requirements.

Figure 12:
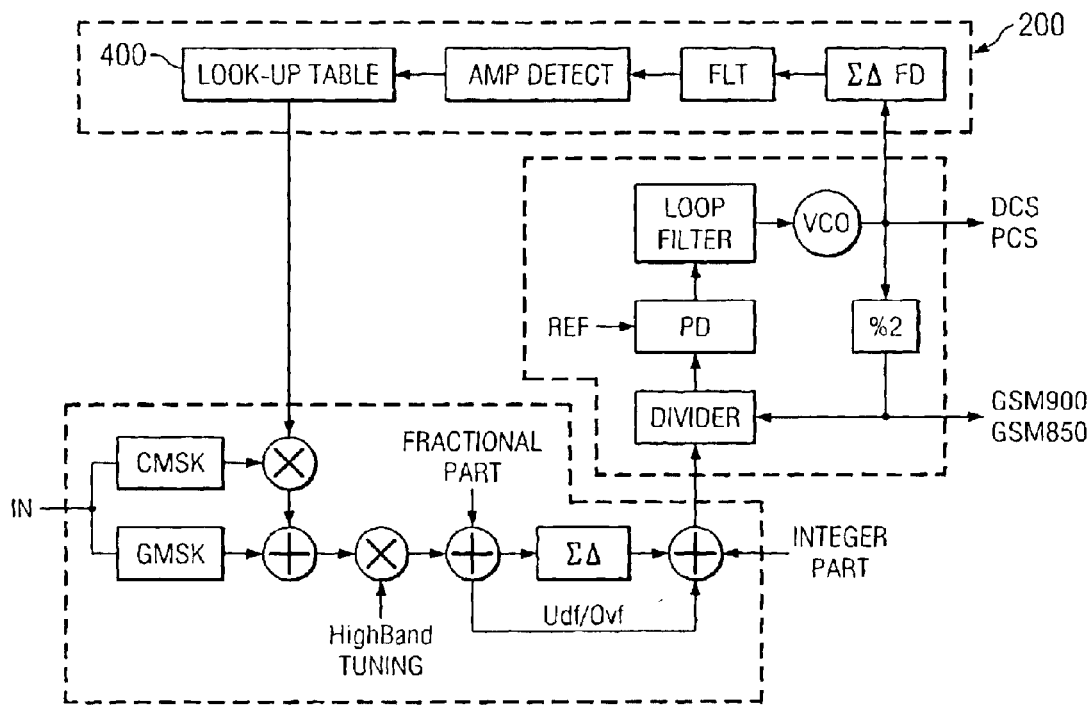
FIG. 12 is a top level block diagram illustrating use of a simple look-up table in association with the PLL gain estimation circuit shown in FIG. 8, to generate the requisite compensation filter gain factor associated with the PLL shown in FIG. 3 according to one embodiment.

FIG. 12 is a block diagram illustrating a PLL having a compensation filter that is represented as the inverse of the PLL transfer function given as equation (1) above. The compensation filter, inverse of the PLL transfer function, is then represented as equation (2) below, wherein $$T^{-1}(s) = 1 + \frac{s}{K} \cdot (1 + as + bs^2 + cs^3). \qquad (2)$$

Assuming the filter poles a, b and c are fixed, the PLL gain K is the only system variable. The compensated GMSK filter, $G_c$, can then be expressed by equation (3) below as a sum of two independent terms, where G is the uncompensated GMSK filter, and $K_{nom}$ the nominal PLL gain.

$$G_c = G + \frac{K_{nom}}{K} \cdot \left[ \frac{G_s}{K_{nom}} \cdot (1 + as + bs^2 + cs^3) \right] \qquad (3)$$

Figure 4B:
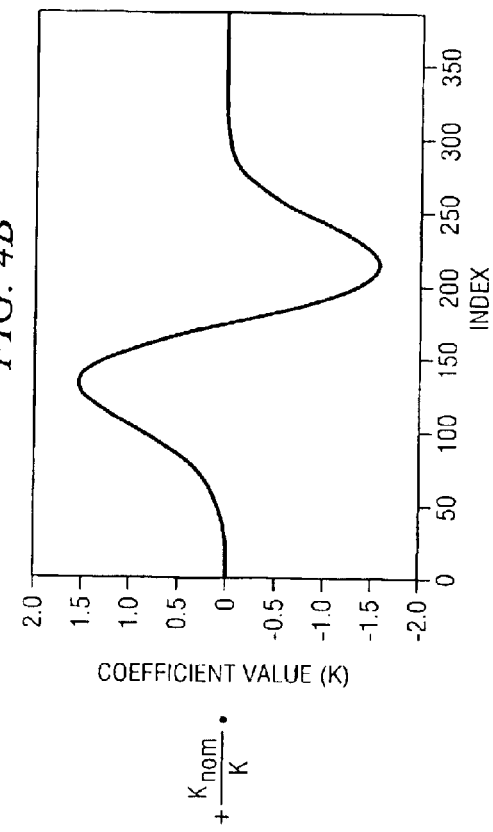
FIG. 4B is a TF plot associated with a compensated GMSK filter according to one embodiment of the present invention.
Figure 4A:
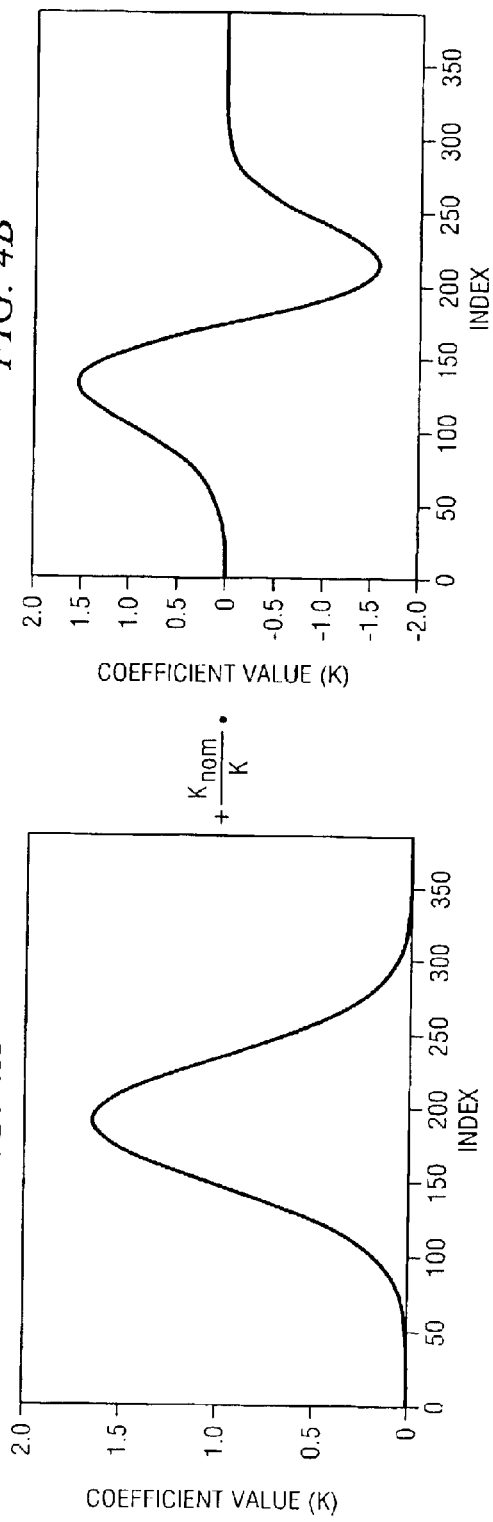
FIG. 4A is a TF plot associated with an uncompensated GMSK filter.

A graphical translation of equation (3) is shown in FIGS. 4A and 4B, wherein FIG. 4A is a plot associated with an uncompensated GMSK filter; and FIG. 4B is a plot associated with the compensation part of the GMSK filter that is weighted by the multiplication factor $$\frac{K_{nom}}{K},$$

the overall sum giving the proper predistortion filter for the PLL transfer function shown as equation (1), according to one embodiment of the present invention.

The time constants of the PLL system are not very sensitive to process variations since they are primarily dominated by capacitor ratios. Equation (4) below, for example, shows the time constant a associated with the first pole, wherein $$a = \frac{C_i + \frac{C_s}{2} + C_2 + C_3}{C_s F_s} + R_2(C_2 + C_3) + R_3 C_3. \qquad (4)$$

Figure 5:
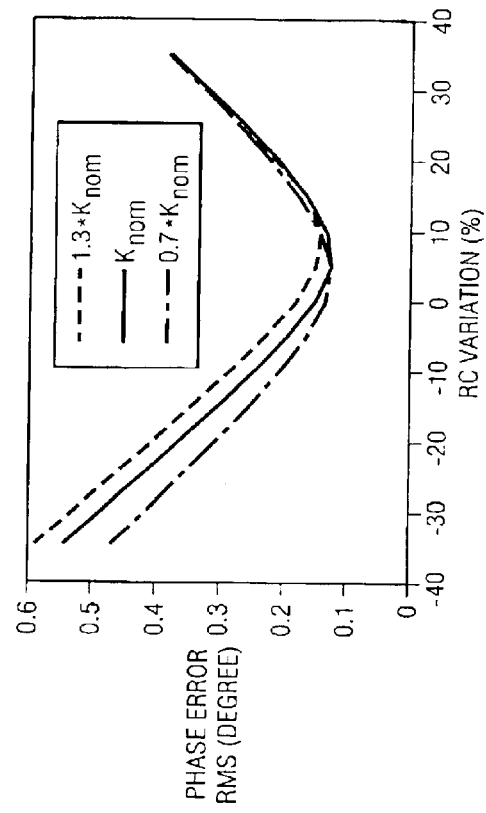
FIG. 5 is a plot showing phase error RMS as a function of RC variation for a compensated filter according to one embodiment of the present invention.
Figure 6:
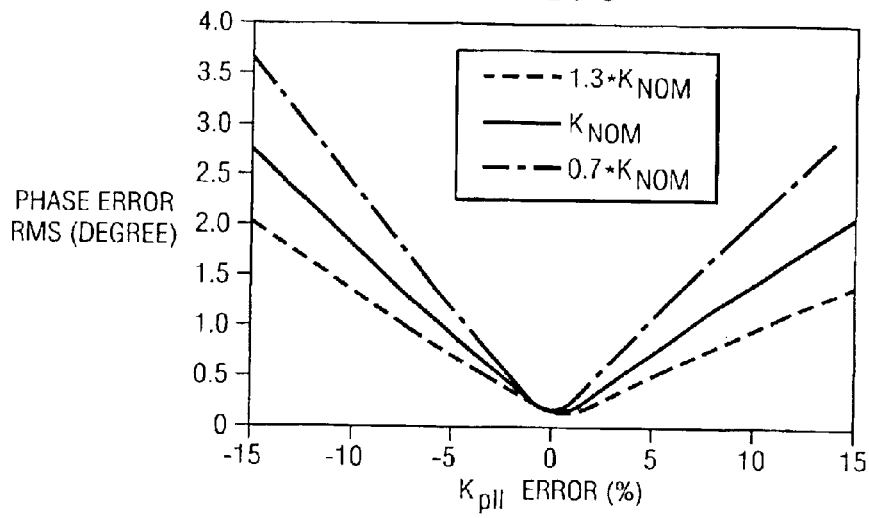
FIG. 6 is a plot showing phase error RMS due to PLL gain variation for a compensated filter according to one embodiment of the present invention.

FIG. 5 is a plot showing RMS phase error as a function of RC (pole) variation of the loop filter, while FIG. 6 is a plot showing RMS phase error due to PLL gain variation according to one embodiment of the present invention. These results show that by estimating the PLL gain K, and applying the gain term $$\frac{K_{nom}}{K}$$

expressed in equation (3) with a relative accuracy of +/−7%, it is possible to achieve a phase error RMS as low as 1.5 degrees in a GSM transceiver.

Figure 7:
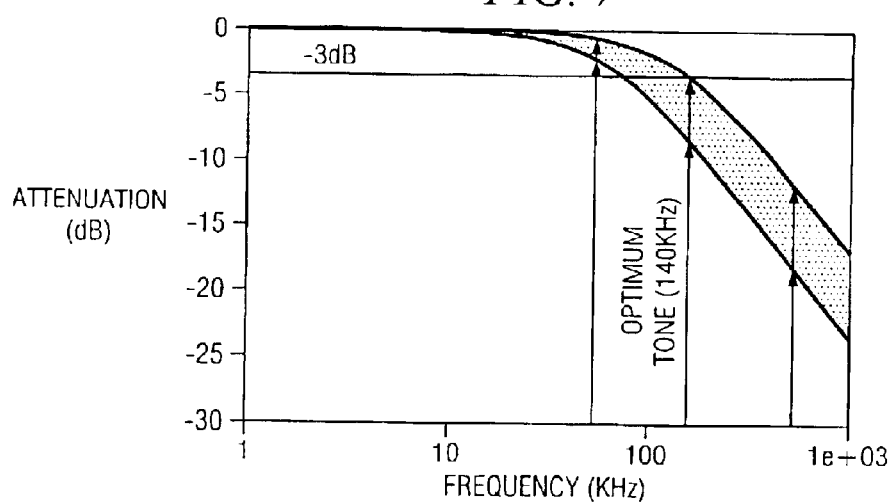
FIG. 7 is a plot showing maximum sensitivity for a single tone modulation at a desired frequency offset for a compensated filter according to one embodiment of the present invention.

If the maximum PLL −3 dB bandwidth (over process, temperature, and the like) is 140 kHz, then a single tone modulation at this frequency offset will determine the PLL gain K, with a maximum sensitivity as shown in FIG. 7; wherein FIG. 7 is a plot showing maximum sensitivity for a single tone modulation at a desired frequency offset for a compensated filter according to one embodiment of the present invention.

Figure 8:
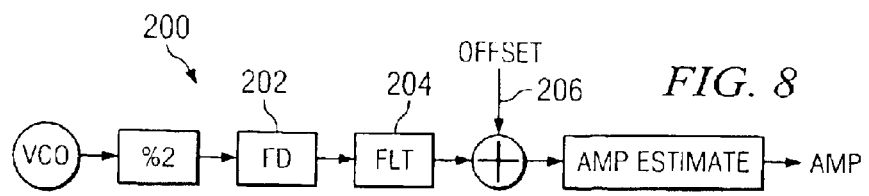
FIG. 8 is a simplified block diagram illustrating a circuit for estimating PLL gain through the measurement of the amplitude of a frequency modulated tone according to one embodiment of the present invention.
Figure 9:
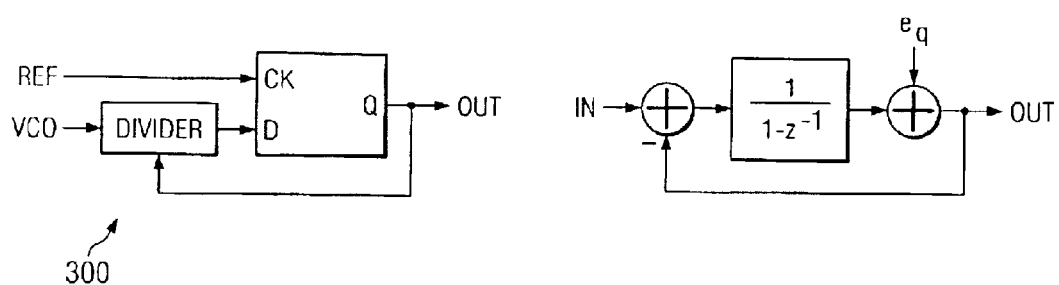
FIG. 9 illustrates a first order $\Sigma\Delta$ frequency to digital converter suitable for use as the frequency discriminator (FD) depicted in FIG. 8.
Figure 10:
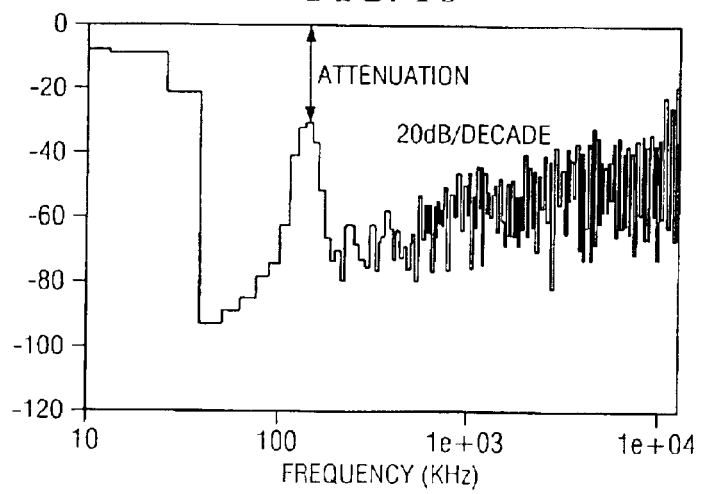
FIG. 10 is a plot illustrating the frequency domain output associated with the $\Sigma\Delta$ frequency to digital converter shown in FIG. 9.

Looking now at FIG. 8, a simplified block diagram illustrates a system 200 for estimating PLL gain through the measurement of the amplitude of a frequency modulated tone according to one embodiment of the present invention. The Frequency Discriminator (FD) 202 can be implemented as a first-order ΣΔ frequency-to-digital converter, as shown in FIG. 9 that illustrates a first order ΣΔ frequency-to-digital converter 300 suitable for use as the frequency discriminator (FD) 202 depicted in FIG. 8. FIG. 10 is a plot illustrating the frequency domain output associated with the ΣΔ frequency-to-digital converter 300 shown in FIG. 9. Looking again at FIG. 8, subsequent digital filtering 204 and offset cancellation 206, were found by the present inventors to yield an estimated signal amplitude with a resolution of about +/−5%.

Figure 11:
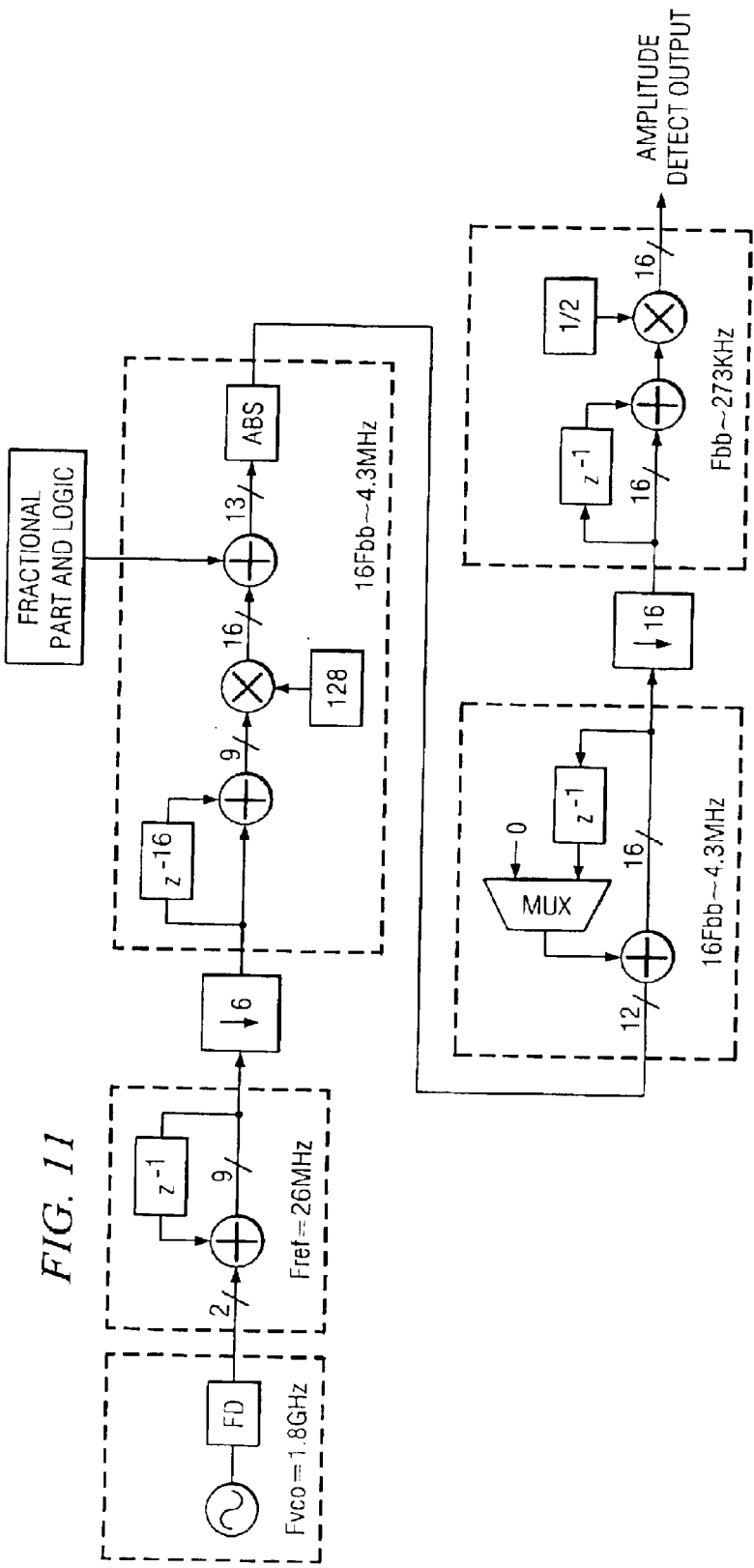
FIG. 11 is a Z-domain schematic diagram of the circuit shown in FIG. 8.

FIG. 11 is simply a Z-domain schematic diagram of the PLL gain estimation circuit 200 shown in FIG. 8.

FIG. 12 is a top level block diagram illustrating use of a simple look-up table 400 in association with the PLL gain estimation circuit 200, to generate the requisite compensation filter gain factor $$\frac{K_{nom}}{K}$$

associated with PLL according to one embodiment.

Figure 13:
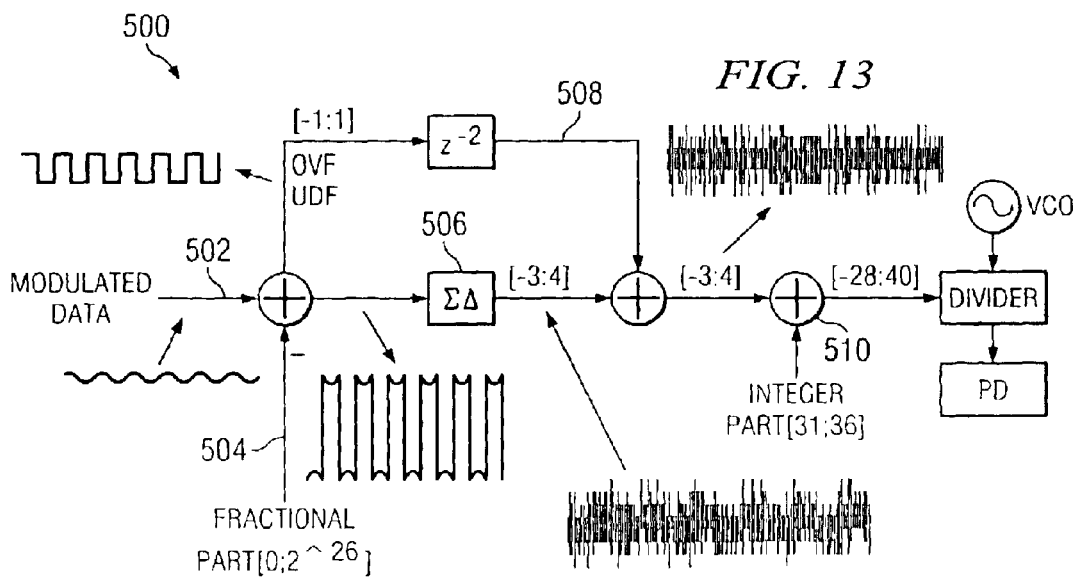
FIG. 13 depicts a high level simulation of the system shown in FIG. 12.

FIG. 13 depicts a high level top simulation 500 of the system shown in FIG. 12. The summation of the modulated data 502 with the fractional part 504 can overflow or underflow the input range of the ΣΔ modulator 506. In order to avoid problems near the integer channels, the adder will allow the data to wrap around 508, and propagate the underflow or overflow signal, respectively −1 or +1, to the integer part adder 510.

Figure 14A:
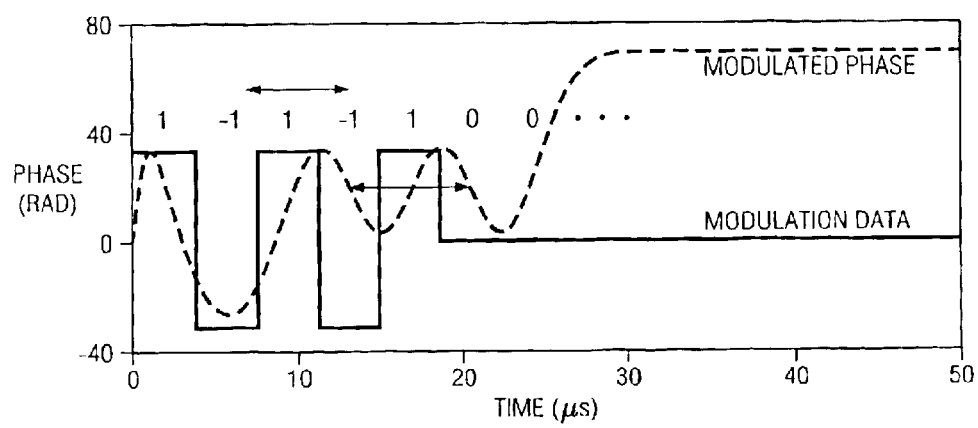
FIG. 14A is a time response plot associated with the system shown in FIG. 13.
Figure 14B:
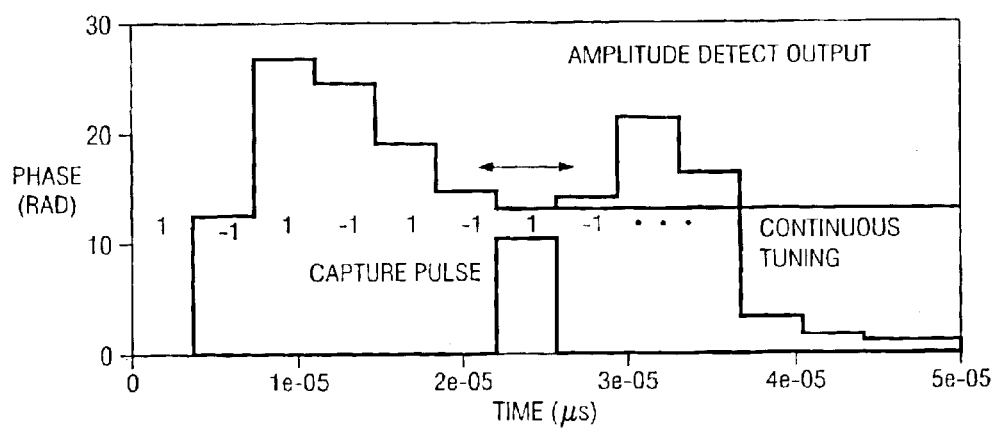
FIG. 14B is an amplitude response plot associated with the system shown in FIG. 13.

FIG. 14A is a time response plot associated with the system 500 shown in FIG. 13; and FIG. 14B is an amplitude response plot associated with the system 500 shown in FIG. 13.

In summary explanation, a technique has been described to fully characterize a specifically designed PLL transfer function through the perturbation and the estimation of the attenuation of a single frequency modulated tone. A predistortion filter has also been described that is characterized as the sum of the original filter and a weighted predistortion filter. The technique overcomes the limited input range associated with known ΣΔ modulators.

In view of the above, it can be seen the present invention presents a significant advancement in the art of PLL schemes and associated methods. This invention has been described in considerable detail in order to provide those skilled in the PLL art with the information need to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method for characterizing a phase locked loop (PLL) transfer function, the method comprising the steps of:
   specifying a PLL having a transfer function defined in terms of a PLL gain and a plurality of time constants associated with a loop filter;
   setting the PLL transfer function poles and zeros to fixed values, independent of process and temperature variations such that unknown PLL parameters are reduced to solely the PLL gain;
   measuring a low frequency modulated single frequency modulated tone signal via the PLL, and generating a perturbation response thereto;
   estimating an attenuation factor based on the perturbation response; and
   characterizing the PLL transfer function associated with the attenuation factor, wherein the attenuation factor determines the PLL gain.

2. The method according to claim 1 wherein the PLL gain is defined as the product of a voltage controlled oscillator (VCO) gain, a phase detector (PD) gain, and a divider gain.

3. The method according to claim 1 wherein the PLL comprises a predistortion filter $G_c$ defined as $$G_c = G + \frac{K_{nom}}{K} \cdot \left[ \frac{Gs}{K_{nom}} \cdot (1 + as + bs^2 + cs^3) \right],$$

where G is an uncompensated GMSK filter, a, b and c are fixed filter poles, and K is the sole filter variable.

4. A method for characterizing a phase locked loop (PLL) transfer function that is dependent solely on the PLL gain K, the method comprising the steps of:
   measuring a low frequency modulated single frequency modulated tone signal via the PLL, and generating a perturbation response thereto;
   estimating an attenuation factor based on the perturbation response; and
   characterizing the PLL transfer function associated with the attenuation factor, wherein the attenuation factor determines the PLL gain K.

5. The method according to claim 4 wherein the PLL gain is defined as the product of a voltage controlled oscillator (VCO) gain, a phase detector (PD) gain, and a divider gain.

6. The method according to claim 4 wherein the PLL comprises a predistortion filter $G_c$ defined as $$G_c = G + \frac{K_{nom}}{K} \cdot \left[ \frac{Gs}{K_{nom}} \cdot (1 + as + bs^2 + cs^3) \right],$$

where G is an uncompensated GMSK filter, a, b and c are fixed filter poles, and K is the sole PLL variable.

7. A phase locked loop (PLL) predistortion filter comprising:
   an uncompensated filter; and
   a weighted predistortion filter, wherein the PLL predistortion filter comprises the sum of the uncompensated filter and the weighted predistortion filter, and further wherein the predistortion filter has only fixed coefficients that do not require computation in association with a tuning block.

8. The PLL predistortion filter according to claim 7, wherein the sum of the uncompensated filter and the weighted predistortion filter is defined as $$G_c = G + \frac{K_{nom}}{K} \cdot \left[ \frac{Gs}{K_{nom}} \cdot (1 + as + bs^2 + cs^3) \right],$$

where G is an uncompensated filter, a, b and c are fixed filter poles, and K is the sole PLL variable.

9. The PLL predistortion filter according to claim 8 wherein G is a GMSK filter.

10. A predistortion filter comprising an uncompensated PLL filter summed with a weighted predistortion filter, wherein the predistortion filter comprises fixed coefficients that are substantially independent of process, voltage and temperature variations, and further comprises no more than one variable element.

11. The predistortion filter according to claim 10, wherein the sum of the uncompensated PLL filter and the weighted predistortion filter is defined as $$G_c = G + \frac{K_{nom}}{K} \cdot \left[ \frac{Gs}{K_{nom}} \cdot (1 + as + bs^2 + cs^3) \right],$$

where G is an uncompensated filter, a, b and c are fixed filter poles, and K is the sole predistortion variable element.

12. The predistortion filter according to claim 11 wherein G is a GMSK filter.

* * * * *